United States Patent [19]
Miwa et al.

[11] Patent Number: 5,391,503
[45] Date of Patent: Feb. 21, 1995

[54] METHOD OF FORMING A STACKED SEMICONDUCTOR DEVICE WHEREIN SEMICONDUCTOR LAYERS AND INSULATING FILMS ARE SEQUENTIALLY STACKED AND FORMING OPENINGS THROUGH SUCH FILMS AND ETCHINGS USING ONE OF THE INSULATING FILMS AS A MASK

[75] Inventors: Hiroyuki Miwa, Kanagawa; Takayuki Gomi, Tokyo; Takashi Noguchi; Norikazu Ohuchi, both of Kanagawa, all of Japan

[73] Assignee: Sony Corporation, Tokyo, Japan

[21] Appl. No.: 944,261

[22] Filed: Sep. 4, 1992

Related U.S. Application Data

[62] Division of Ser. No. 881,869, May 12, 1992, abandoned.

[30] Foreign Application Priority Data

| May 13, 1991 | [JP] | Japan | 3-107387 |
| May 14, 1991 | [JP] | Japan | 3-138505 |
| May 31, 1991 | [JP] | Japan | 3-155179 |

[51] Int. Cl.⁶ .......................... H01L 21/265
[52] U.S. Cl. .......................... 437/31; 437/189; 437/193; 437/195; 148/DIG. 10
[58] Field of Search ............ 437/31, 189, 193, 195, 437/148, DIG. 10, DIG. 11

[56] References Cited

U.S. PATENT DOCUMENTS

| 4,319,932 | 3/1982 | Jambotkar | 437/31 |
| 4,543,707 | 1/1985 | Ito et al. | 437/31 |
| 4,800,171 | 1/1989 | Irammanesh et al. | 437/31 |
| 4,826,780 | 5/1989 | Takemoto et al. | 437/31 |
| 4,857,476 | 8/1989 | Colinge | 437/31 |
| 4,952,521 | 8/1990 | Goto | 437/193 |
| 4,967,253 | 10/1990 | Jambotkar | 257/587 |
| 4,980,305 | 12/1990 | Kadota et al. | 437/31 |
| 4,994,400 | 2/1991 | Yamaguchi et al. | 437/31 |
| 4,996,581 | 2/1991 | Hamasaki | 437/31 |
| 5,010,039 | 4/1991 | Ku et al. | 437/195 |
| 5,183,768 | 2/1993 | Kameyama et al. | 437/31 |
| 5,234,844 | 8/1993 | Okita | 437/193 |
| 5,234,846 | 8/1993 | Chu et al. | 437/31 |
| 5,266,504 | 11/1993 | Blouse et al. | 437/31 |

FOREIGN PATENT DOCUMENTS 0030144 1/1990 Japan ................. 437/193

*Primary Examiner*—Olik Chaudhuri
*Assistant Examiner*—Long Pham
*Attorney, Agent, or Firm*—Hill, Steadman & Simpson

[57] ABSTRACT

According to this invention, a base extracting electrode is formed using a polysilicon side wall self-aligned with a base region so as to reduce a collector-base parasitic capacitance of a transistor. A base layer is formed on a semiconductor substrate by a selective epitaxial method using an MBE method to obtain a high-speed operation. A high impurity-concentration region is formed on a buried layer immediately below an emitter by pedestal ion implantation to reduce a collector series resistance. In addition, a specific layer of a plurality of polysilicon layers is selectively annealed by radiation of an eximer laser to operate the transistor at high speed and to obtain a highly accurate resistor element.

4 Claims, 14 Drawing Sheets

METHOD OF FORMING A STACKED SEMICONDUCTOR DEVICE WHEREIN SEMICONDUCTOR LAYERS AND INSULATING FILMS ARE SEQUENTIALLY STACKED AND FORMING OPENINGS THROUGH SUCH FILMS AND ETCHINGS USING ONE OF THE INSULATING FILMS AS A MASK

This is a division of application Ser. No. 07/881,869, filed May 12, 1992, now abandoned.

BACKGROUND OF THE INVENTION

1. Field of the Invention

The present invention relates to a semiconductor device and a method of manufacturing the same wherein, when the semiconductor device is to be self-alignedly formed, first, a base is formed by a selective growth method using a molecular beam epitaxial method, second, a high impurity-concentration region (pedestal ion-implanted portion) is formed in a collector region immediately below an emitter region, and third, a plurality of polysilicon films are used as wiring layers.

2. Description of the Prior Art

First, a bipolar transistor is used in the central component of equipment such as a super computer and an optical communication apparatus requiring a high-speed operation, and the bipolar transistor requires a high-speed operation to operate the equipment at high speed. In order to obtain a high-speed operation, a high-concentration base layer having a very small thickness must be formed, and parasitic capacitances (emitter-base capacitance, base-collector capacitance and collector-substrate capacitance) and parasitic resistances (base resistance, emitter resistance and collector saturation resistance) must be decreased.

In a conventional technique, the base of a bipolar transistor is formed using a molecular beam epitaxial selective growth method (to be referred to as MBE hereinafter) in place of an ion implantation method or a diffusion method. In addition, a bipolar transistor using a so-called SSSB (super self-aligned selectively grown base) structure for a high integration density is proposed. In the SSSB structure, a polysilicon external base electrode and a polysilicon emitter region are formed on an epitaxial substrate self-alignedly with a high-concentration base layer.

FIG. 1 shows a typical example. In FIG. 1, reference numeral 31 denotes a p-type silicon substrate; 32, an n-type (high concentration) collector region; 34, an n-type (low concentration) epitaxial layer; 35, an element isolation region formed by a trench; and 36, a base layer formed by MBE. Reference numerals 37, 38, and 39 respectively denote an emitter layer, an external base layer, and a collector layer each of which is formed by a polysilicon layer. In addition, reference numerals 40, 41, and 42 respectively denote an emitter electrode, a base electrode, and a collector electrode each, of which is formed by a PtSi layer and a tungsten layer.

As an example of forming a base layer using MBE, a method of manufacturing a semiconductor device is disclosed in Japanese Patent Laid-Open No. 1-173642. According to this method, as shown in FIG. 2A, after an n-type buried layer 52 is formed on a p-type silicon substrate 51, an n-type epitaxial layer 53 is stacked on the silicon substrate 51.

As shown in FIG. 2B, a field insulating layer 54, a p-type base extracting polysilicon layer 55, and an SiO₂ film 56 are sequentially stacked on the resultant structure, and a portion serving as an emitter region is etched to expose the n-type epitaxial layer 53.

As shown in FIG. 2C, an Si film is deposited on the entire surface of the resultant structure, and the Si film is partially removed by RIE (Reactive Ion Etching) to form a polysilicon step portion 57. Thereafter, an Si film is selectively epitaxially grown at a portion serving as an emitter region on the n-type epitaxial layer 53 to form a p-type epitaxial base layer 58.

As shown in FIG. 3A, an SiO₂ film is deposited on the entire surface of the resultant structure, and the SiO₂ film is partially removed by RIE to form an SiO₂ insulating step portion 59. Thereafter, an emitter polysilicon layer 60 is formed on the emitter portion, and an n-type impurity is diffused from the emitter polysilicon layer 60 to form an emitter diffused region 61 in the base layer.

As shown in FIG. 3B, after a base contact hole 62 is formed, an emitter electrode 63 and a base electrode 64 are formed by Al deposition, thereby obtaining a super high-speed bipolar transistor.

In the transistor shown in FIG. 1, however, as in the enlarged view of FIG. 4, a base contact width dc (FIG. 5) depends on an undercut amount du obtained when a dielectric film 71 serving as the lowermost layer is etched. Therefore, when a thickness t of the dielectric film 71 is increased to reduce a collector-base capacitance, the contact width dc is disadvantageously increased.

As shown in FIG. 5, since an undercut portion 72 must be buried by the base layer 36 and the polysilicon layer (external base layer) 38 grown when an MBE operation is performed, the thickness t of the dielectric film 71 serving as the lowermost layer must be set to be twice a base width tb. Therefore, in accordance with a decrease in thickness of the base layer 36, the thickness of the dielectric film 71 is decreased to disadvantageously cause an increase in collector-base capacitance.

In the manufacturing method shown in FIGS. 2A to 3B, since the polysilicon step portion 57 is formed such that the etching is performed by RIE, the silicon substrate (the n-type epitaxial layer 53) under the polysilicon step portion 57 is damaged, and the characteristics of the bipolar transistor are considerably degraded disadvantageously.

Second, a pedestal ion implantation is advantageously performed to obtain a high-performance bipolar transistor. According to the pedestal ion implantation, an n⁺-type region in case of an npn transistor is selectively formed immediately below an intrinsic collector by high-energy ion implantation, thereby decreasing a collector series resistance and suppressing a Kirk effect.

The decrease in collector series resistance and the like can also be achieved by increasing the impurity concentration of the whole collector. In this case, however, a base-collector junction capacitance is increased to degrade the performance of the transistor.

In manufacturing a transistor having a so-called two-layered polysilicon film structure in which a base extracting electrode and an emitter extracting electrode are respectively formed by polysilicon films of different layers, pedestal ion implantation is conventionally performed as follows.

That is, openings for forming an emitter and a base are formed using a resist as a mask in a base extracting electrode polysilicon film and an SiO₂ film serving as an interlayer insulator covering the polysilicon film. After the resist is removed, the pedestal ion implantation is performed using the SiO₂ film as a mask.

As described above, however, since the pedestal ion implantation is performed with a high energy, the thickness of the SiO₂ film must be increased under the condition that only the SiO₂ film is used as a mask. However, since the SiO₂ film serving as the an interlayer insulator is not removed, when the thickness of the SiO₂ film is increased, the steps of a contact hole and the like are increased. Therefore, according to the conventional method, a wiring line is frequently disconnected at the step portions, and a high-quality semiconductor device cannot be manufactured.

Third, in a semiconductor device, a plurality of polysilicon films are often formed on a semiconductor substrate. For example, in a semiconductor integrated circuit device including a bipolar transistor and a resistor element, the resistor element is formed by the first layer polysilicon film on the semiconductor substrate, an emitter extracting electrode is formed by the second layer polysilicon film, and an emitter and the like may be formed by performing solid phase diffusion of an impurity from the emitter extracting electrode.

When a resistor element is to be formed by a polysilicon film, annealing is generally performed such that dangling bonds at grain boundary of the polysilicon film are terminated to improve the crystallinity of the polysilicon film. In addition, the annealing is required to perform solid phase diffusion of an impurity from the emitter extracting electrode.

As the above annealing, conventional annealing using a halogen lamp is generally performed. In this annealing, high-temperature rapid annealing can be performed, and a shallow junction is formed while an activation ratio is increased in solid phase diffusion of an impurity. Therefore, a high-performance bipolar transistor having a high-speed operation and low power consumption can be obtained.

However, the beam of the halogen lamp has a wavelength falling within a range of 0.2 to 6.0 μm or more, and a light component having a long wavelength and a high transmittance has a high light intensity. For this reason, the beam reaches the layer under the emitter extracting electrode covered with an insulating film such as an SiO₂ film or the like, and the temperature of the first layer polysilicon film forming the resistor element is increased.

As a result, crystal grains are grown in the first layer polysilicon film, and the growth of the crystal grains depends on the crystallinity of the first layer polysilicon film prior to the growth. However, since the growth of the crystal grains is not easily controlled, the resistance of the resistor element is varied. That is, in the conventional annealing using the halogen lamp, a high-speed bipolar transistor and a highly accurate resistor element cannot be easily obtained at the same time.

OBJECTS AND SUMMARY OF THE INVENTION

The present invention has been made in consideration of the above problems, and has as its object to provide a semiconductor device in which the thickness of a base layer and a base contact width can be decreased while an increase in parasitic capacitance between a collector and a base is prevented.

It is another object of the present invention to provide a method of manufacturing a semiconductor device in which the thickness of a base layer and a base contact width can be decreased while an increase in parasitic capacitance between a collector and a base is prevented, and the semiconductor device can be formed without damaging a silicon substrate and the like in the steps in manufacturing the semiconductor device.

In order to achieve the above objects, according to the present invention, there is provided a semiconductor device wherein an extracting electrode 3 formed on a first insulating film 2 on the surface of a substrate 1 of a first conductivity type is connected to the substrate 1 through an opening 4 formed in the surface of the substrate 1, a second insulating film (side wall) 5 is formed on a portion of a side wall of the extracting electrode 3 in the opening 4, a first semiconductor layer (base layer) 6 of a second conductivity type connected to the substrate 1 and the side wall of the extracting electrode 3 at a portion which is not covered with the second insulating film 5 is formed, a second semiconductor layer (emitter layer) 7 of the first conductivity type connected to the first semiconductor layer 6 is formed, and the second semiconductor layer 7 is isolated from the extracting electrode 3 by the second insulating film 5.

According to the present invention, a method of manufacturing a semiconductor device is performed as follows. After a first insulating film 2, a first semiconductor layer 9 of a second conductivity type, and a second insulating film 8 are sequentially formed on a substrate 1 of a first conductivity type, a first opening 4 reaching the surface of the substrate 1 is formed. Thereafter, a second semiconductor layer 10 of the second conductivity type and a third insulating film 5 are sequentially stacked on the entire surface of the resultant structure including the first opening 4, and the third insulating film 5 is anisotropically etched back to leave the third insulating, film 5 on only the side wall of the semiconductor layer (a side wall 5 is formed). Thereafter, the second semiconductor layer 10 on the surface of the resultant structure is removed by isotropic etching using the third insulating film 5 as a mask to expose a part of the substrate 1, thereby obtaining a second opening 11. Thereafter, a first single-crystal semiconductor layer (base layer) 6 of the second conductivity type is formed in the second opening 11 by using a molecular beam epitaxial selective growth method, and a third semiconductor layer (emitter layer) 7 of the first conductivity type is formed on the first single-crystal semiconductor layer 6. In this case, the third semiconductor layer 6 may be formed by using the molecular beam epitaxial selective growth method.

According to the present invention, the method of manufacturing a semiconductor device is performed as follows. After a first insulating film 21 is formed on a substrate 1 of a first conductivity type, a second insulating film 22 having etching characteristics different from those of the first insulating film 21, a first semiconductor layer 9 of a second conductivity type, and a third insulating film 8 are sequentially stacked on the first insulating film 21. Thereafter, a first opening 4 reaching the surface of the first insulating film 21 is formed, and only the second insulating film 22 is selectively side-etched by isotropic etching to form a first undercut portion 23. Thereafter, a second semiconductor layer 10 of the second conductivity type is deposited on the entire surface of the resultant structure including the first opening 4, and the second semiconductor layer 10 is left only in the first undercut portion 23. Thereafter, a fourth insulating film 24 having etching characteristics different from those of the first insulating film 21 is deposited, and the fourth insulating film 24 is anisotropically etched back to leave the fourth insulating film 24 on only the side wall of the first opening 4 (the side wall 24 is formed). Thereafter, the first insulating film 21 on the substrate 1 is removed by isotropic etching using the third and fourth insulating films 8 and 24 as masks to expose a part of the substrate 1, so that a second opening 11 is formed and a second undercut portion 25 is formed on the first insulating film 21. Thereafter, a first single-crystal semiconductor layer (base layer) 6 of the second conductivity type is formed in the second opening 25 using a molecular beam epitaxial selective growth method, and a third semiconductor layer (emitter layer) 7 of the first conductivity type is formed on the first single-crystal semiconductor layer 6. In this case, the third semiconductor layer 7 may be formed by the molecular beam epitaxial selective growth method.

According to the above arrangement of the present invention, an external base electrode 3 and the substrate 1 can be connected to each other in a small region under the third insulating film (side wall) 5. In addition, since the first insulating film 2 serving as the lowermost layer has no undercut portion formed by etching, a contact width dc between the external base electrode 3 and the substrate 1 does not depend on the thickness of the first insulating film 2. Therefore, the contact width dc can be reduced without a decrease in thickness of the first insulating film 2 serving as the lowermost layer, and the element area of the bipolar transistor itself can be decreased. For this reason, the base contact width dc and the thickness of the base layer 6 can be reduced while an increase in parasitic capacitance between the collector and the base can be prevented. In addition, since the thin base layer 6 and the emitter layer 7 can be continuously formed, the manufacturing process can be effectively simplified.

According to the present invention, the second method of manufacturing a semiconductor device is performed as follows. A second semiconductor layer 10 is formed on the entire surface of a semiconductor substrate including a first opening 4, and a side wall 5 is formed. The polysilicon layer 10 is self-alignedly left on the side wall of the first opening 4 by the side wall 5, the remaining polysilicon layer 10 is used as an external base electrode 3, and the polysilicon layer 10 is connected to a base layer 6 formed by MBE. Therefore, a base width tb and a base contact width dc can be decreased at the same time. In addition, since the thickness of a first insulating film 2 serving as a lowermost layer can be increased independently of the thickness of the base layer 6, a collector-base parasitic capacitance can be reduced. Furthermore, since isotropic etching having selectivity to an epitaxial layer is used as a method of removing the polysilicon layer 10, an epitaxial layer 1 is not damaged.

According to the present invention, the third method of manufacturing a semiconductor device is performed as follows. An insulating film formed below a first semiconductor layer 9 has a two-layered structure constituted by a first insulating film 21 and a second insulating film 22, a second semiconductor layer 10 is buried in an undercut portion 23 of the second insulating film 22 in advance, and an undercut portion 25 of the first insulating film 21 is buried during an MBE operation. Therefore, a base width tb and a base contact width dc can be reduced at the same time while an increase in parasitic capacitance between a collector and a base is prevented. In addition, since isotropic etching (wet etching) having selectivity to an epitaxial layer 1 is used as a method of removing the first insulating film 21, the epitaxial layer 1 is not damaged.

According to the present invention, in order to decrease a collector series resistance, a method of manufacturing a semiconductor device comprises the steps of forming a pattern resist 125 for forming an opening 126 corresponding to an emitter 137, a base 136, and a collector 113a in a conductive film 122 serving as a base extracting electrode and an interlayer insulator 124 covering the conductive film 122 on the insulating interlayer 124, and doping an impurity in a semiconductor substrate 113 using at least the resist 125 as a mask to form an impurity region 127.

As described above, although at least the resist 125 is used as a mask when the impurity region 127 is formed, since the resist 125 is removed later, the resist 125 can have a desired thickness. Therefore, the resist 125 having a thickness required for a mask can be obtained, and the thickness of the interlayer insulator 124 can be smaller than that of a case wherein only the interlayer insulator 124 is used as a mask.

In order to obtain a high-speed operation of a bipolar transistor and a highly accurate resistor element at the same time, a lower polysilicon film 222a of two-layered polysilicon films 222a and 232 is annealed by radiation of an eximer laser beam, the lower polysilicon film 222a is covered with the upper polysilicon film 232 of the two-layered polysilicon films 222a and 232 through an interlayer insulator 224, and the upper polysilicon film 232 is annealed by radiation of an eximer laser beam.

For this reason, when the upper polysilicon film 232 of the two-layered polysilicon films 222a and 232 is annealed, the lower polysilicon film 222a is covered with the upper polysilicon film 232.

An eximer laser beam used in the annealing is an almost monochrome beam and is not easily transmitted through a polysilicon film. Therefore, the lower polysilicon film 222a is not annealed when the upper polysilicon film 232 is annealed.

DETAILED DESCRIPTION OF THE PREFERRED EMBODIMENTS

Embodiments of the present invention will be described below with reference to FIGS. 6 to 24.

Figure 1:
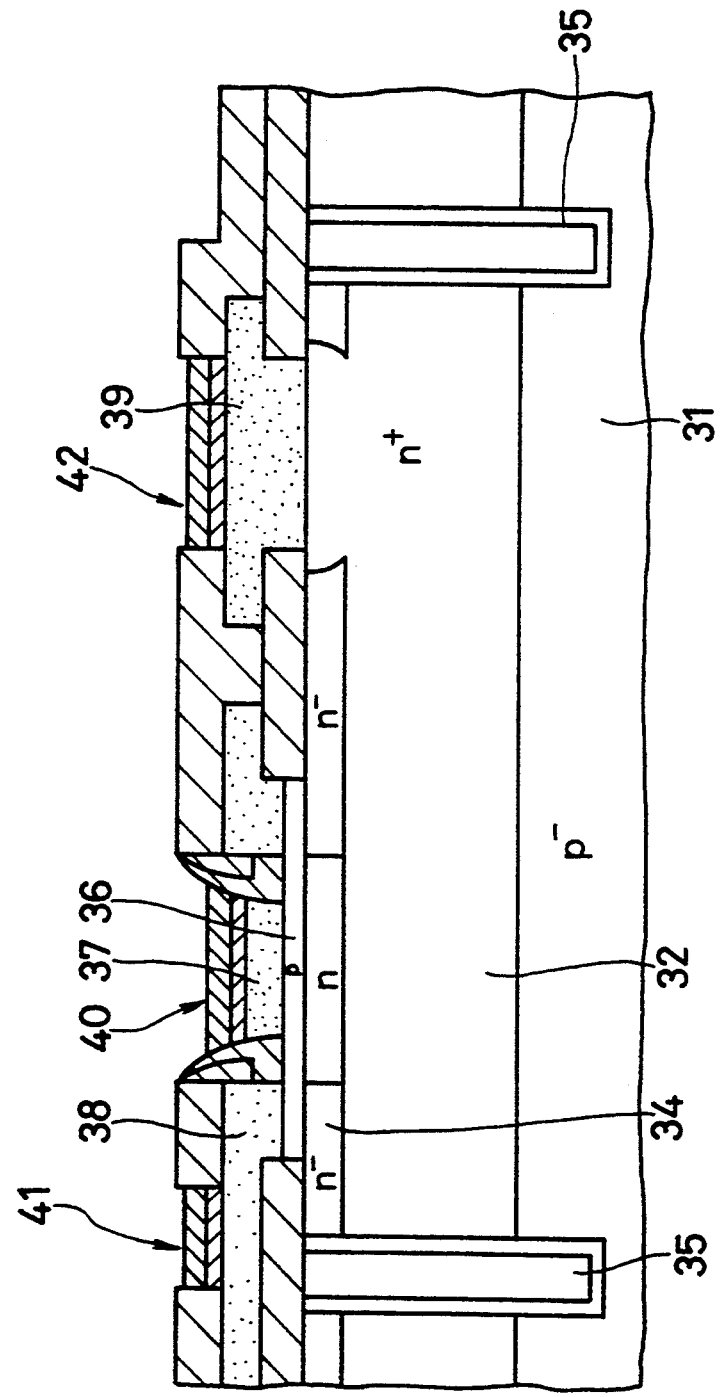
FIG. 1 is a sectional view showing an arrangement of a conventional semiconductor device.
Figure 2A:
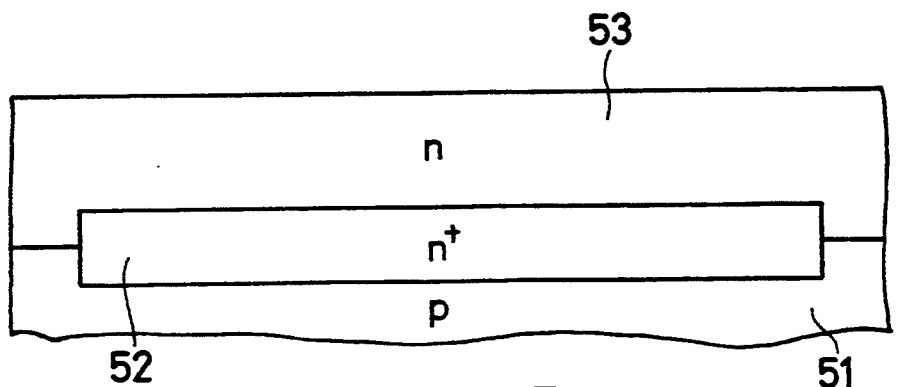
FIGS. 2A to 2C, 3A and 3B are views showing the steps of a conventional method of manufacturing a semiconductor device.
Figure 2B:
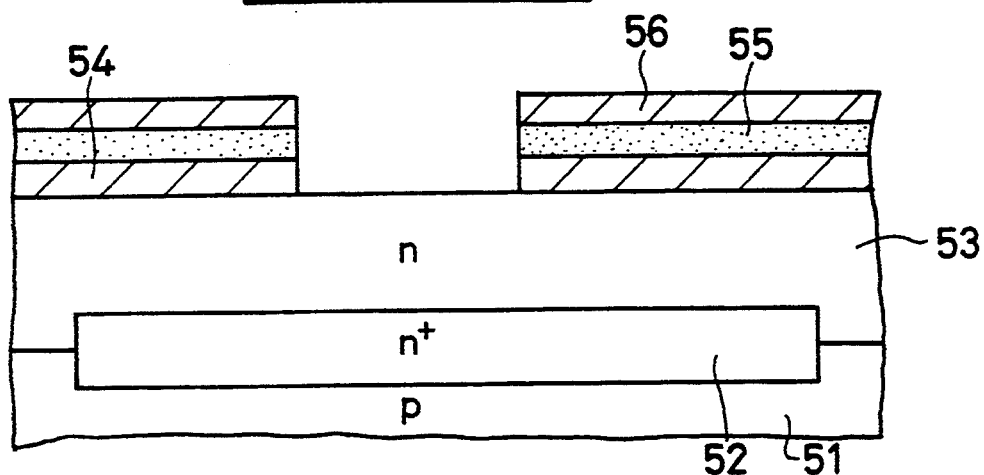
Figure 2C:
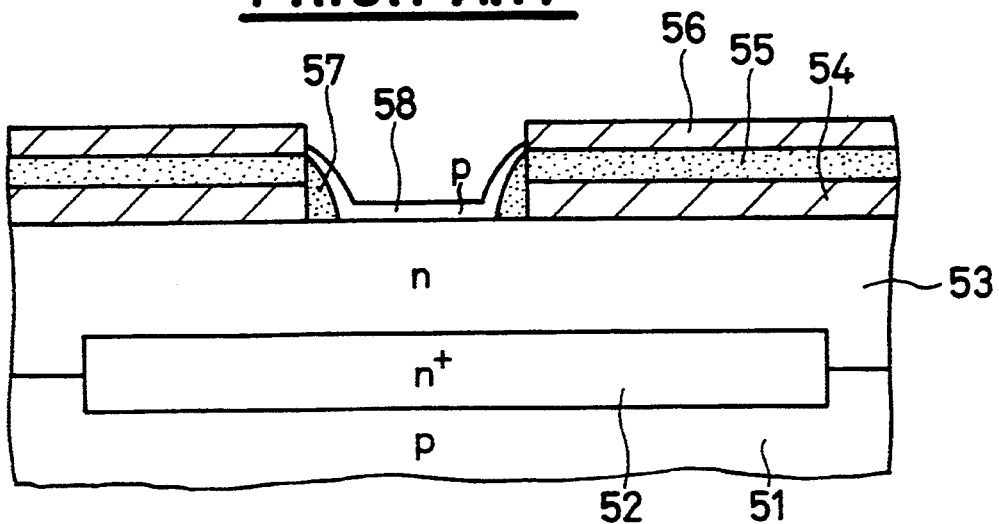
Figure 3A:
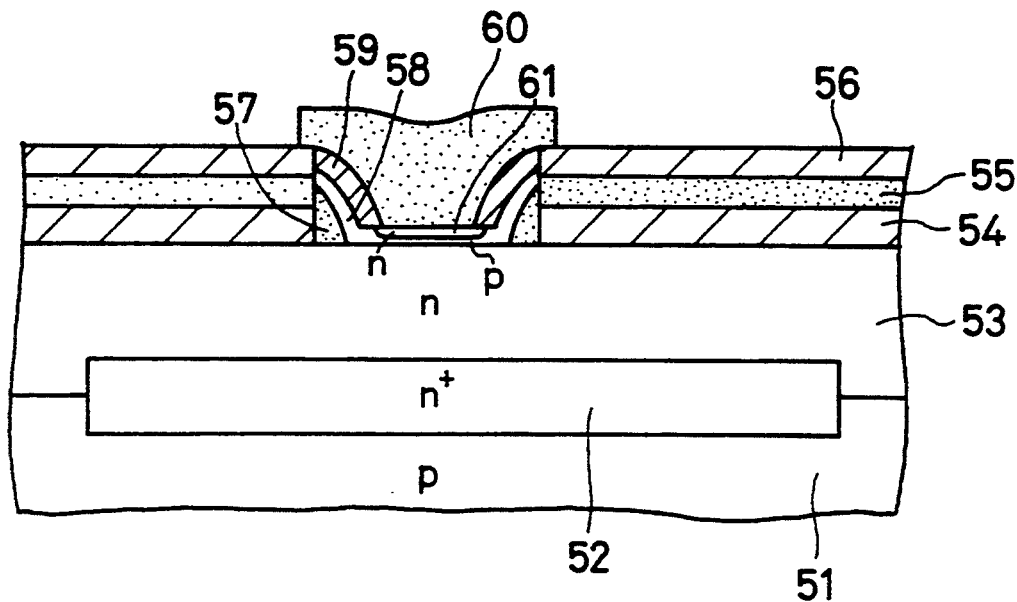
Figure 3B:
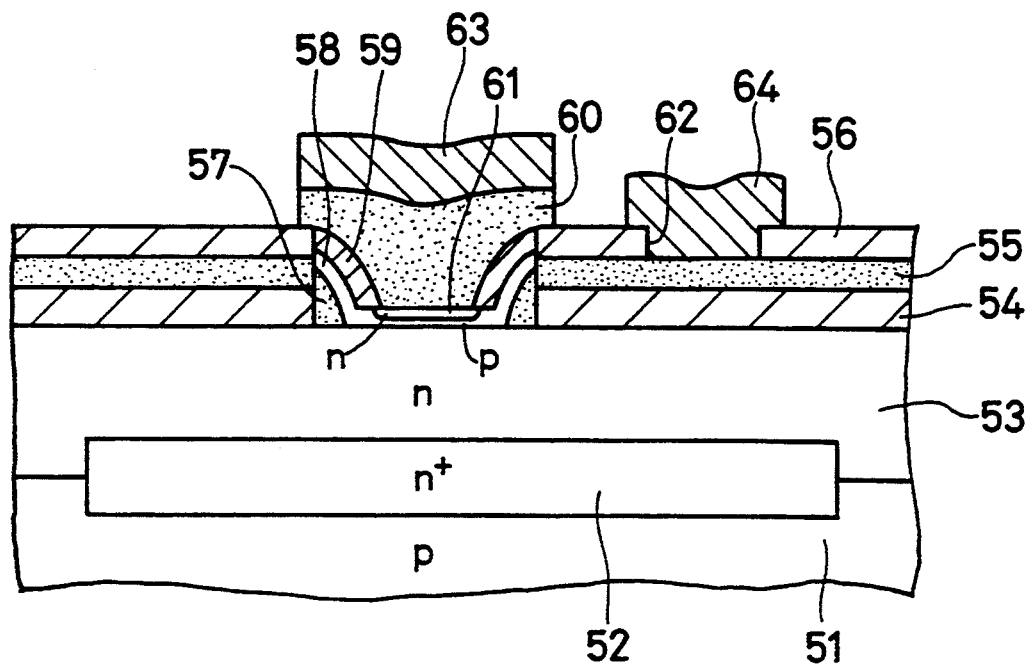
Figure 4:
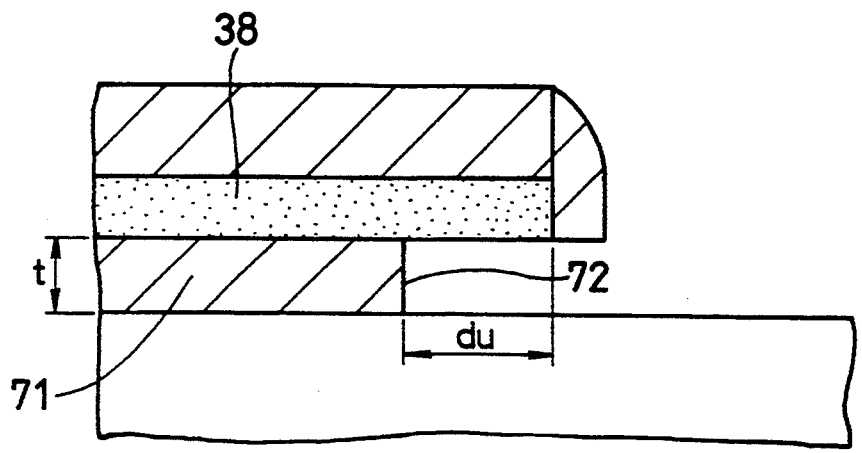
FIGS. 4 and 5 are views for explaining functions of a conventional semiconductor device.
Figure 5:
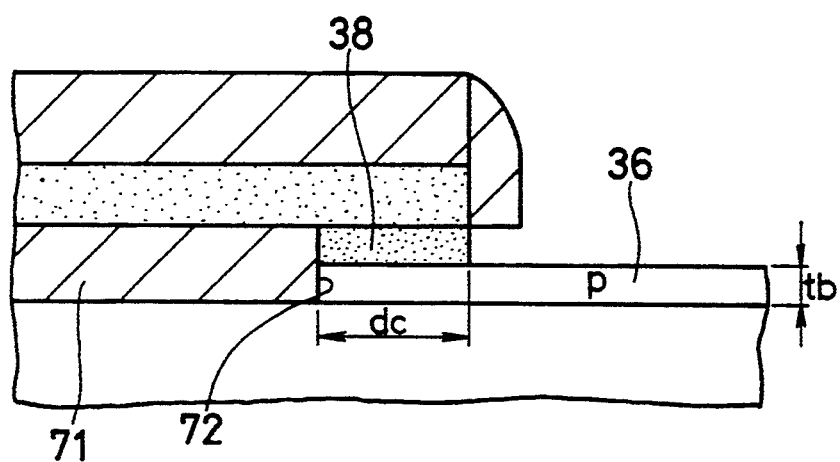
Figure 6:
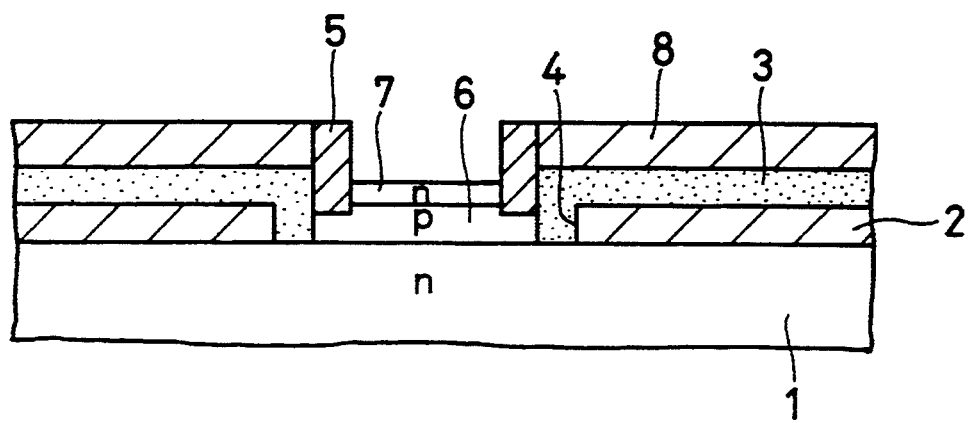
FIG. 6 is a sectional view showing an arrangement of a main part of a first embodiment.

FIG. 6 is a view showing an arrangement of a main part of a super high-speed bipolar transistor according to an embodiment of the present invention.

This transistor is formed as follows. An external base electrode 3 consisting of a polysilicon layer is formed on an SiO$_2$ film 2 formed on, e.g., an n-type epitaxial layer 1, and the external base electrode 3 is connected to the epitaxial layer 1 at the peripheral portion of an opening 4 formed in the surface of the epitaxial layer 1. At the same time, a side wall 5 consisting of SiO$_2$ is formed on a part of the side wall of the external base electrode 3 in the opening 4, a p-type base layer 6 respectively connected to the epitaxial layer 1 thereunder and the side wall portion of the external base electrode 3 which is not covered with the side wall 5 is formed in the external base electrode 3, and an n-type emitter layer 7 connected to the base layer 6 in the opening 4 is formed. In addition, the emitter layer 7 is isolated from the external base electrode 3 by the side wall 5. Note that reference numeral 8 denotes an SiO$_2$ film.

A method of manufacturing a bipolar transistor according to the above embodiment will be described below with reference to FIGS. 7A to 8B. The reference numerals as in FIGS. 6 denote the same parts in FIGS. 7A to 8B.

Figure 7A:
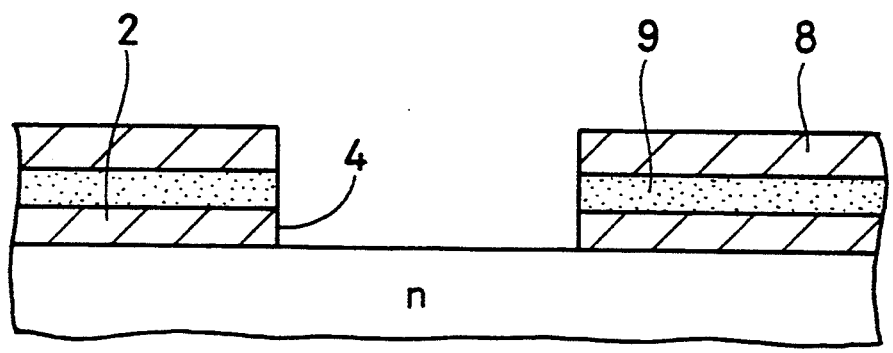
FIG. 7A to 7C, 8A and 8B are views showing the steps of a method of manufacturing a semiconductor device according to the first embodiment of the present invention.

As shown in FIG. 7A, the SiO$_2$ film 2, a p-type polysilicon layer 9, and the SiO$_2$ film 8 are sequentially stacked on the n-type epitaxial layer 1. Thereafter, the opening 4 extending through the SiO$_2$ film 2, the polysilicon layer 9, and the SiO$_2$ film 8 is formed in a portion where an emitter region (or base region) is to be formed. The epitaxial layer 1 is formed to have a surface orientation of <111> in this embodiment.

Figure 7B:
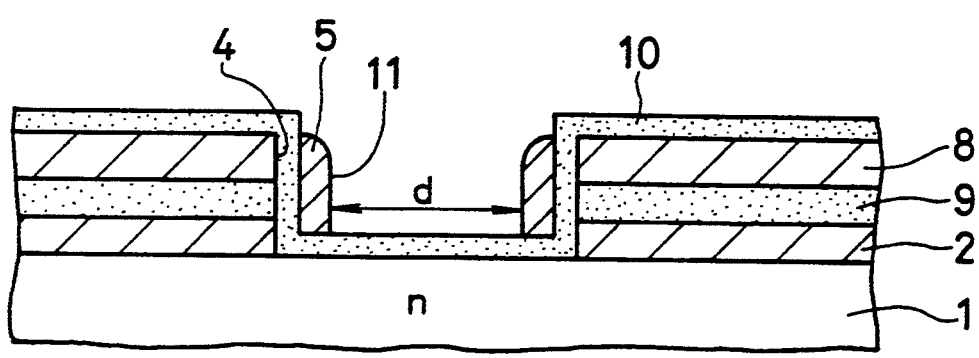

As shown in FIG. 7B, a p-type thin film polysilicon layer 10 having a thickness of about 200 Å is formed on the entire surface of the resultant structure including the opening 4 by, e.g., a CVD method. After an SiO$_2$ film 5 is formed on the entire surface of the resultant structure by, e.g., a CVD method, the SiO$_2$ film 5 is etched back by RIE to be partially left on the side wall of the polysilicon layer 10. That is, the side wall 5 is formed by the SiO$_2$ film. At this time, the diameter d of an opening 11 formed by the side wall 5 is about 0.2 μm.

Figure 7C:
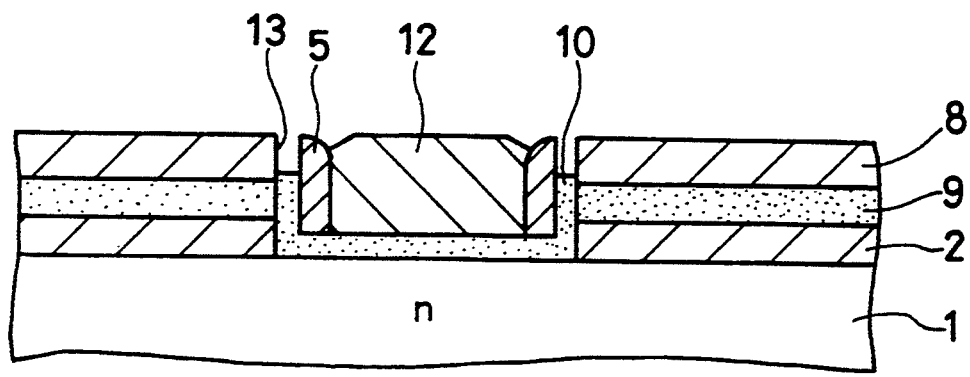

As shown in FIG. 7C, after a resist film 12 is buried in the opening 11, the polysilicon layer 10 on the surface of the resultant structure is removed by wet etching using an ammonium hydrogen peroxide, an aqueous KOH solution, or the like. At this time, a groove 13 is formed between the side wall 5 and the SiO$_2$ film 8 when the polysilicon layer 10 is removed by etching.

Figure 8A:
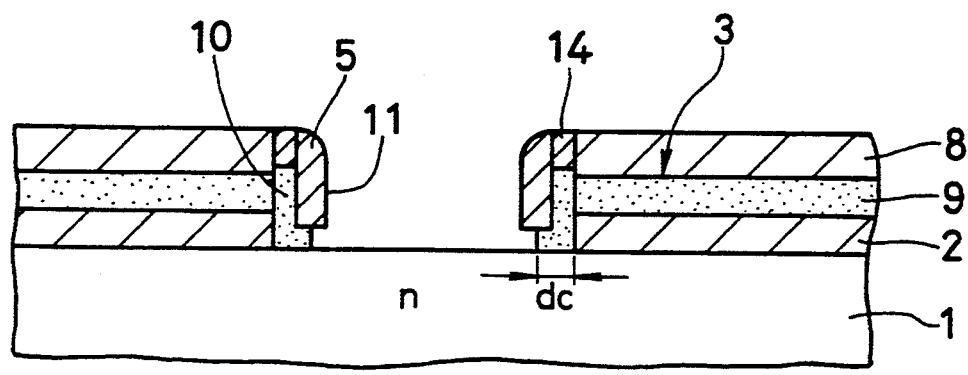

As shown in FIG. 8A, after the resist film 12 is removed, an SiO$_2$ film 14 is formed on the entire surface of the resultant structure. The SiO$_2$ film 14 is etched back by, e.g., RIE, to be left in the groove 13. Therefore, the side wall 5 and the SiO$_2$ film 8 are integrated with each other by the SiO$_2$ film 14 buried in the groove 13. Thereafter, the exposed polysilicon layer 10 is removed by wet etching using an ammonium hydrogen peroxide, an aqueous KOH solution, or the like. The polysilicon layer 10 may be removed by RIE, as a matter of course.

The remaining polysilicon layer 10 and the polysilicon layer 9 on the SiO$_2$ film 2 constitute the external base electrode 3. In this case, since the epitaxial layer 1 has a surface orientation of <111>, even when the polysilicon layer 10 is removed by dry etching using RIE, the surface of the epitaxial layer 1 is slightly damaged. In addition, when the polysilicon layer 10 is removed by wet etching, the epitaxial layer 1 is not damaged. In this case, since the polysilicon layer 10 under the side wall 5 is side-etched, a contact width dc between the external base electrode 3 and the epitaxial layer 1 becomes very small.

Figure 8B:
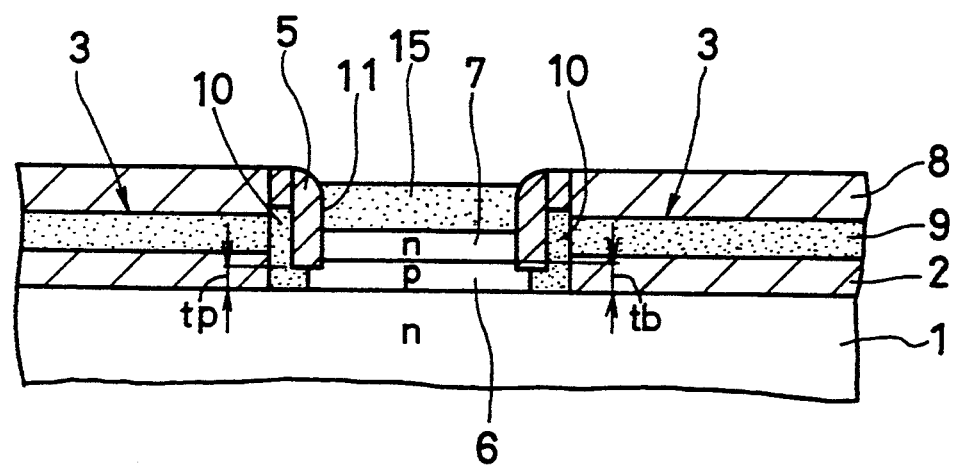

As shown in FIG. 8B, the p-type base layer 6 consisting of SiGe and having a thickness of about 50 nm is formed in the opening 11 by a molecular beam epitaxial selective growth method (to be referred to as MBE hereinafter). In this case, the thickness tb of the base layer 6 is preferably larger than a thickness tp of the polysilicon layer 10. Thereafter, the emitter layer 7 consisting of SiC and having a thickness of about 50 run is formed on the,base layer 6 by MBE.

At this time, the junction between the base and the emitter may be a heterojunction such that the concentration inclination of the base layer 6 or the emitter layer 7 is controlled to decrease the bandgap of the base or to increase the bandgap of the emitter. In this case, a high current amplification efficiency and excellent high-frequency characteristics can De obtained. Thereafter, the temperature of the MBE is decreased to form an n-type polysilicon layer 15 on the emitter layer. The resultant structure is subjected to RTA (rapid thermal anneal) at a temperature of 1,050° C. to recover the crystallinity, thereby obtaining a super high-speed bipolar transistor according to this embodiment.

As described above, according to this embodiment, the external base electrode 3 and the epitaxial layer 1 can be connected to each other in a small region under the side wall 5. In addition, since the SiO$_2$ film 2 serving as the lowermost layer is not undercut by etching, the contact width dc between the external base electrode 3 and the epitaxial layer 1 does not depend on the thickness of the SiO$_2$ film 2. Therefore, the contact width dc and the element area of the bipolar transistor itself can be decreased without a decrease in thickness of the SiO$_2$ film 2 serving as the lowermost layer. For this reason, while an increase in collector-base parasitic capacitance is prevented, the thickness of the base layer 6 and the base contact width dc can be decreased.

Since the thin base layer 6 and the emitter layer 7 can be continuously formed, the manufacturing process can be effectively simplified. In addition, a 50-nm SiGe film and a 50-nm SiC can be used as the base layer 6 and the emitter layer 7, respectively, and a switching speed of Sub10 psec. can be obtained.

Two methods of manufacturing a super high-speed bipolar transistor capable of decreasing a damage to an epitaxial layer 1 will be described below with reference to FIGS. 9A to 12C.

FIGS. 9A to 10B are views showing the steps of the second embodiment of the present invention. The steps will be sequentially described below.

Figure 9A:
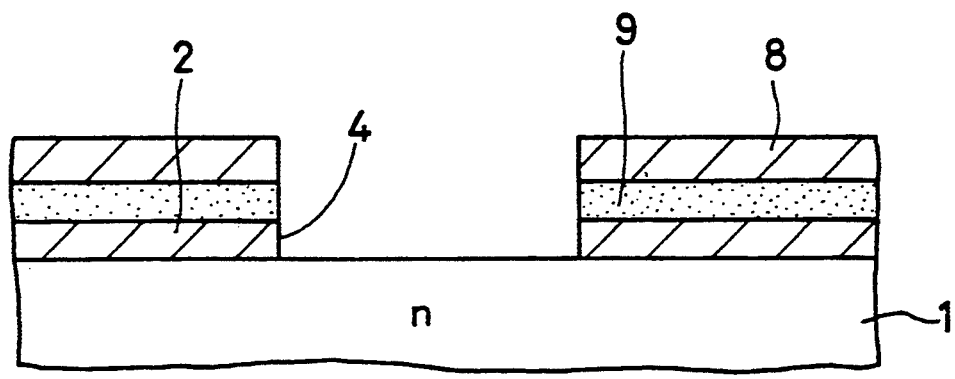
FIGS. 9A to 9C, 10A and 10B are views showing the steps of a method of manufacturing a semiconductor device according to the second embodiment of the present invention.

As shown in FIG. 9A, an SiO$_2$ film 2, a p-type polysilicon layer 9, and an SiO$_2$ film 8 are sequentially stacked on an n-type epitaxial layer 1. An opening 4 extending through the SiO$_2$ film 2, the polysilicon layer 9, and the SiO$_2$ film 8 is formed in a portion where an emitter region (or base region) is to be formed. In this embodiment, the epitaxial layer 1 is formed to have a surface orientation of <111>.

Figure 9B:
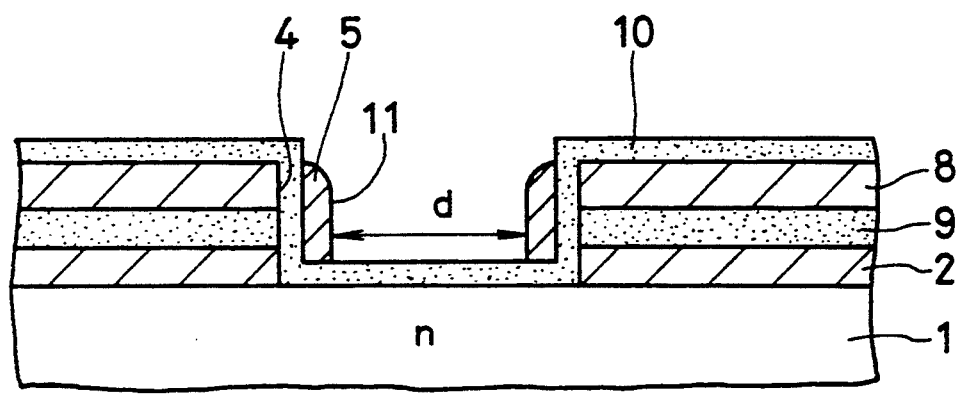

As shown in FIG. 9B, a p-type thin polysilicon layer 10 having a thickness of about 20 nm is formed on the entire surface of the resultant structure including the opening 4 by, e.g., a CVD method. After an SiO$_2$ film 5 is formed on the entire surface by the CVD method, the SiO$_2$ film 5 is etched back by RIE to be partially left on the side wall of the polysilicon layer 10. That is, a side wall 5 is formed by the SiO$_2$ film. At this time, the diameter d of an opening 11 constituted by the side wall 5 is about 0.2 μm.

Figure 9C:
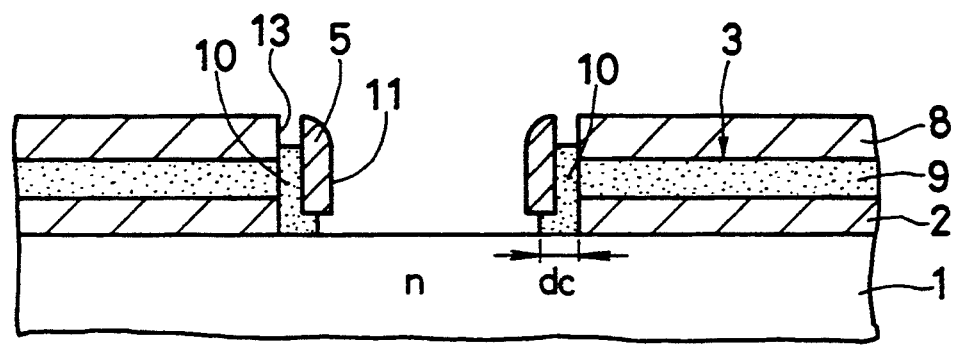

As shown in FIG. 9C, the polysilicon layer 10 on the surface of the resultant structure is removed by wet etching using an ammonium hydrogen peroxide, an aqueous KOH solution, or the like and using the side wall 5 as a mask. At this time, a groove 13 is formed between the side wall 5 and the SiO$_2$ film 8 when the polysilicon layer 10 is removed by etching, and the polysilicon layer 10 under the side wall 5 is side-etched. In this case, the remaining polysilicon layer 10 and a polysilicon layer 9 on the SiO$_2$ film 2 constitute an external base electrode 3, and a contact width dc between the external base electrode 3 and the epitaxial layer 1 is decreased by side-etching the polysilicon layer 10.

Since the polysilicon layer 10 is removed using isotropic etching (wet etching) having selectivity to the epitaxial layer 1 serving as the underlayer, the epitaxial layer 1 is not damaged. In addition, since the epitaxial layer 1 has a surface orientation of <111>, even when the above etching is performed, the epitaxial layer 1 has good crystallinity.

Figure 10A:
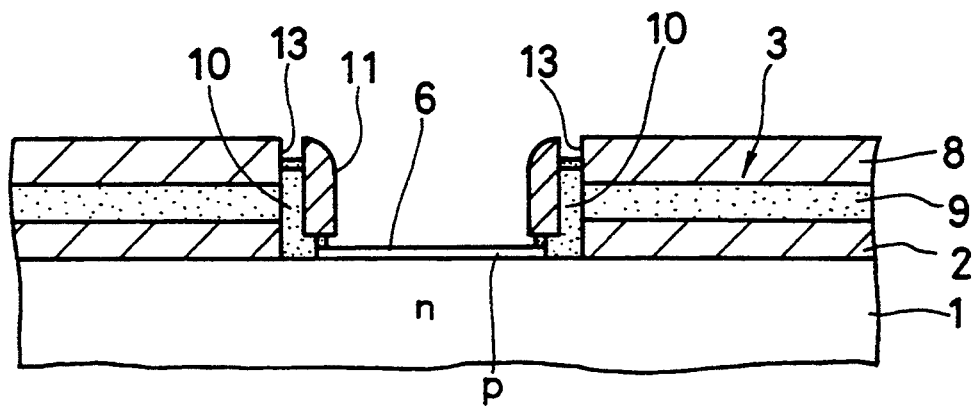

As shown in FIG. 10A, a p-type base layer 6 consisting of Si single crystal and having a thickness smaller than that of the polysilicon layer 10 is formed in the opening 11 using MBE. At this time, the polysilicon layer 10 exposed in the opening 11 is grown in the lateral direction by MBE, and the polysilicon layer 10 exposed from the groove 13 is grown upward.

Figure 10B:
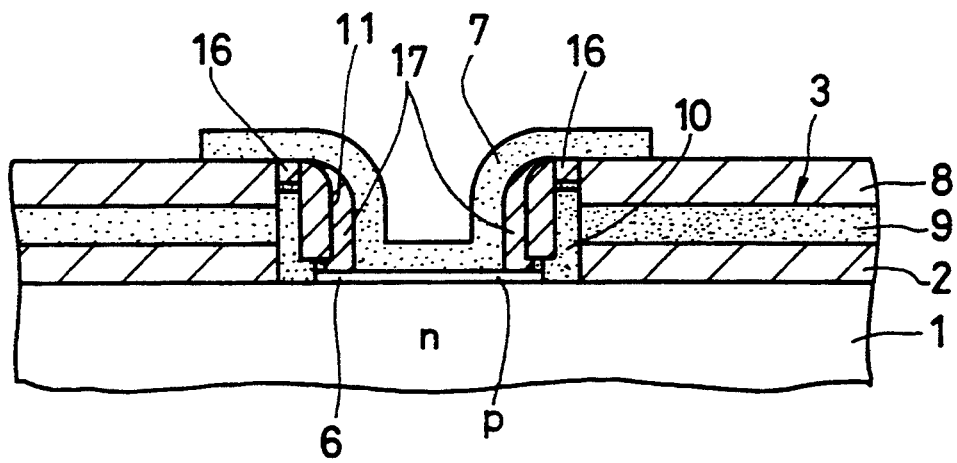

As shown in FIG. 10B, after an SiO$_2$ film 16 is formed on the resultant structure by, e.g., a CVD method, the SiO$_2$ film 16 is etched back to be buried in the groove 13, and a side wall 17 consisting of the SiO$_2$ film 16 is formed in the opening 11. After an n-type polysilicon layer constituting an emitter layer 7 is formed in the opening 11 by, e.g., a CVD method, the n-type polysilicon layer is subjected to RTA (rapid thermal anneal) at a temperature of 1,050° C. to recover the crystallinity, thereby obtaining a super high-speed bipolar transistor according to the second embodiment.

In the manufacturing method according to the second embodiment of the present invention, the polysilicon layer 10 is formed on the entire surface including the opening 4, the side wall 5 is formed, and the polysilicon layer 10 is self-alignedly left on the side wall of the opening 4 by the side wall 5. The remaining polysilicon layer 10 is used as the external base electrode 3, and the polysilicon layer 10 and the base layer 6 formed by MBE are connected to each other. For this reason, the base width and the base contact width dc can be decreased at the same time. In addition, since the thickness of the SiO$_2$ film 2 serving as the lowermost layer can be increased independently of the thickness of the base layer 6, a collector-base parasitic capacitance can be decreased. Since the polysilicon layer 10 is removed by isotropic etching (wet etching) having selectivity to the epitaxial layer, the epitaxial layer 1 is not damaged.

FIGS. 11A to 12C are views showing the steps of a third embodiment of the present invention related to the above super high-speed bipolar transistor. The steps will be sequentially described below.

Figure 11A:
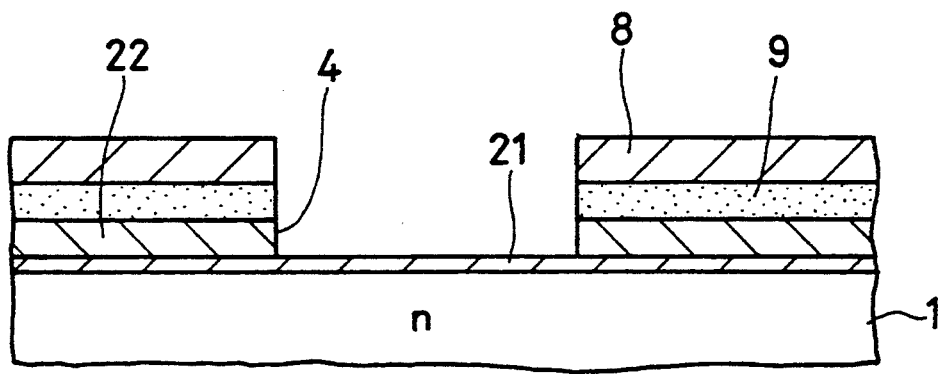
FIGS. 11A to 11C and 12A to 12C are views showing the steps of a method of manufacturing a semiconductor device according to the third embodiment of the present invention.

As shown in FIG. 11A, after an SiO$_2$ film 21 having a thickness of about 1,000 Å is formed on an n-type epitaxial layer 1, an SiN film 22 having etching characteristics different from those of the SiO$_2$ film 21 is formed on the SiO$_2$ film 21, and a p-type polysilicon film 9 and an SiO$_2$ film 8 are sequentially stacked on the SiN film 22. Thereafter, an opening 4 extending through the SiO$_2$ film 8, the polysilicon layer 9, and the SiN film 22 is formed in a portion wherein an emitter region (or base region) is to be formed. The opening 4 is formed under an RIE condition having an etching selectivity of 10 or more to SiO$_2$. The epitaxial layer 1 is formed to have a surface orientation of <111> in this embodiment.

Figure 11B:
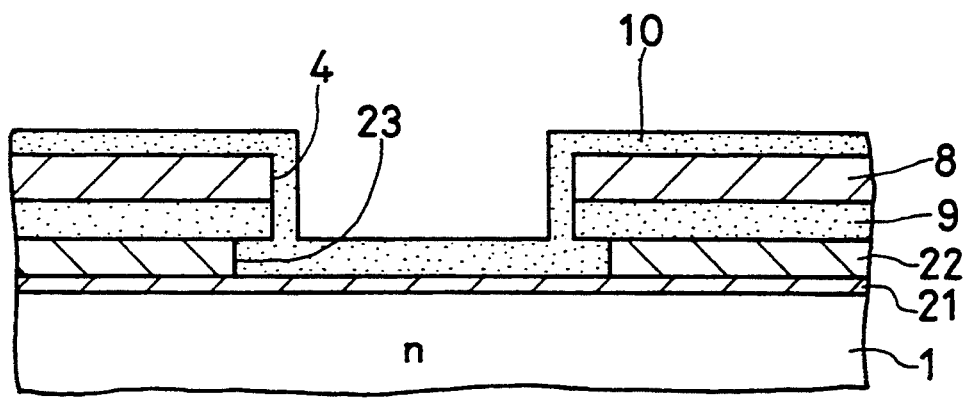

As shown in FIG. 11B, the SiN film 22 is side-etched by wet etching using hot phosphoric acid. Thereafter, a polysilicon layer 10 is formed on the entire surface of the resultant structure by a CVD method. At this time, the polysilicon layer 10 is buried in an undercut portion 23 formed by side-etching the SiN 22.

Figure 11C:
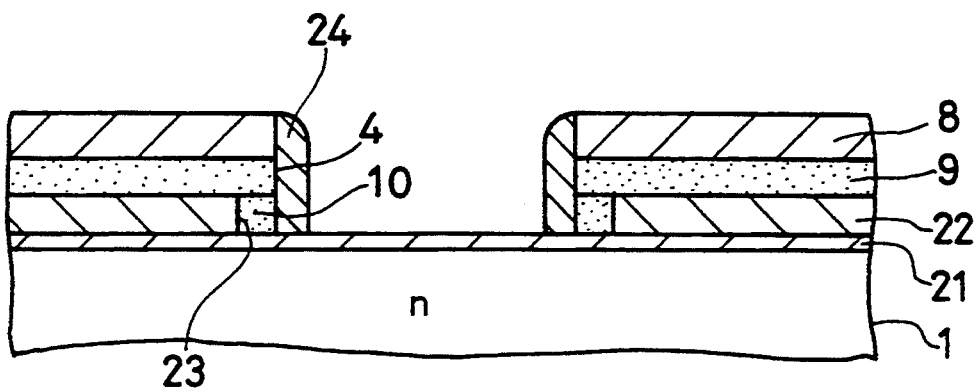

As shown in FIG. 11C, the polysilicon layer 10 is etched back by RIE to be left only in the undercut portion 23. After an SiN film 24 having etching characteristics different from those of the SiO$_2$ film 21 is formed on the entire surface of the resultant structure, the SiN film 24 is etched back to be left on the side wall of the opening 4. That is, the side wall 24 is formed by the SiN film.

Figure 12A:
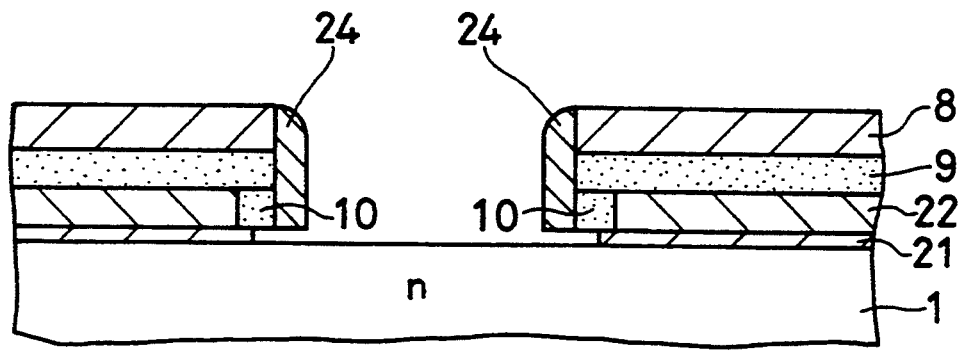

As shown in FIG. 12A, the exposed SiO$_2$ film 21 is removed by wet etching. Since this wet etching is isotropic, the SiO$_2$ film 21 is side-etched in the lateral direction to reach the polysilicon layer 10.

Figure 12B:
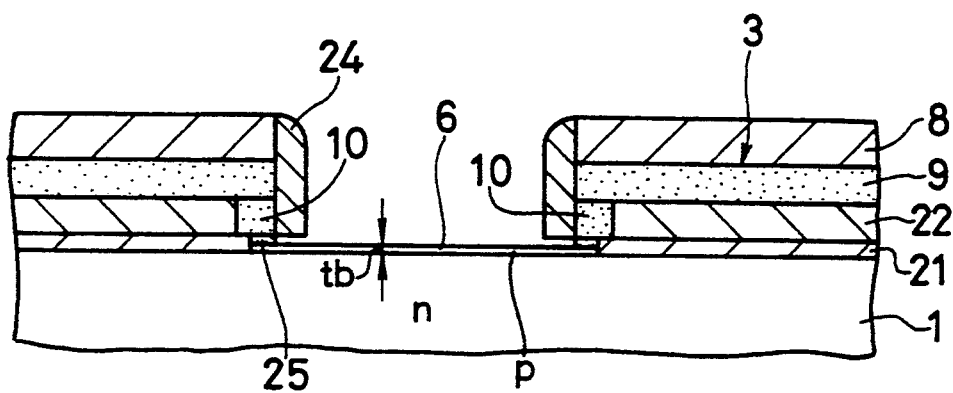

As shown in FIG. 12B, a p-type base layer 6 consisting of Si single crystal and having a thickness smaller than that of the SiO$_2$ film 21 is formed in the opening 4 using MBE. At this time, in an undercut portion 25 of the SiO$_2$ film 21, the polysilicon layer 10 having no SiO$_2$ film 21 as an underlayer is grown downward, and the polysilicon layer 10 is connected to the base layer 6 which is grown upward. In this case, a base width tb is about 50 nm. In addition, an external base electrode 3 is constituted by the polysilicon layer 10 and the polysilicon layer 9 on the SiO$_2$ film 21.

Figure 12C:
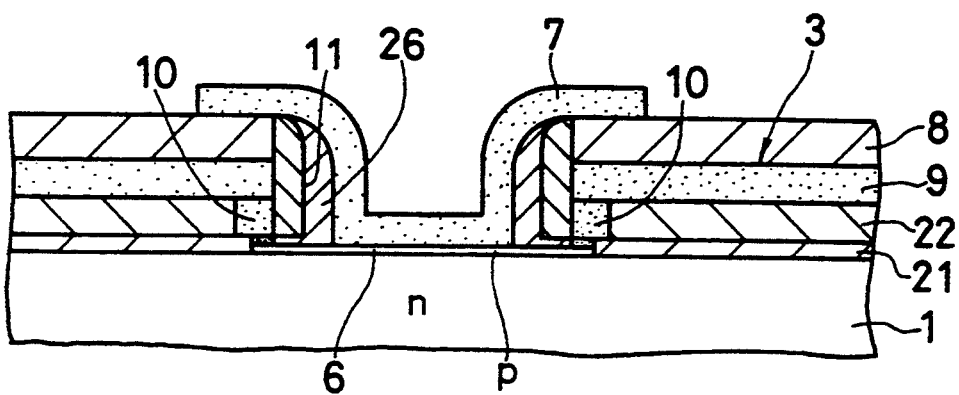

As shown in FIG. 12C, after an SiO$_2$ film 26 is formed on the entire surface of the resultant structure by, e.g., a low-pressure CVD method, the SiO$_2$ film 26 is etched back to form a side wall 26 consisting of an SiO$_2$ film in an opening 11 formed by the side wall 24. After an n-type polysilicon layer constituting an emitter layer 7 is formed in the opening 11 by, e.g., a CVD method, the n-type polysilicon layer is subjected to RTA (rapid thermal anneal) at a temperature of 1,050° C. to recover the crystallinity, thereby obtaining a super high-speed bipolar transistor according to the third embodiment.

In the manufacturing method according to the third embodiment, an insulating film formed as the underlayer of the polysilicon layer 9 has a two-layered structure constituted by the SiO$_2$ film 21 and the SiN film 22, the polysilicon layer 10 is buried in the undercut portion 23 of the SiN film 22 in advance, and the undercut portion 25 of the SiO$_2$ film 21 is buried during the MBE operation. For this reason, a base width and a base contact width can be decreased at the same time without preventing an increase in a collector-base parasitic capacitance. In addition, since the SiO$_2$ film 21 is removed by isotropic etching (wet etching) having selectivity to the epitaxial layer 1, the epitaxial layer 1 is not damaged.

In the above second and third embodiments, an n-type polysilicon layer is used as the emitter layer 7. However, as shown in FIG. 6, the emitter layer 7 may be formed by MBE. In this case, when the junction between the base and the emitter is a heterojunction such that the concentration inclination of the base layer 6 or the emitter layer 7 is controlled to decrease the bandgap of the base or to increase the bandgap of the emitter, in addition to the above effects, a high current amplification efficiency and excellent high-frequency characteristics can be obtained.

The fourth to seventh embodiments of the present invention for reducing a collector series resistance will be described below with reference to FIGS. 13 to 18.

Figure 13:
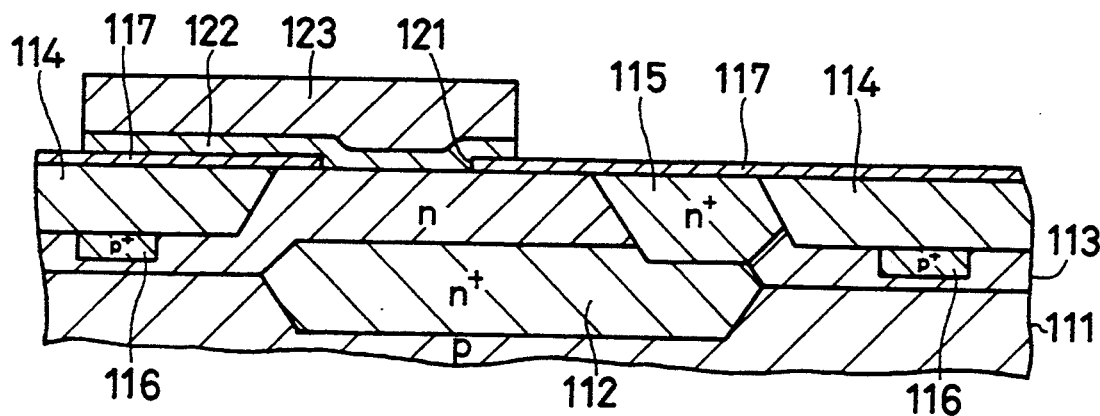
FIGS. 13 to 18 are views showing the steps of a method of manufacturing a semiconductor device according to the fourth embodiment of the present invention.

FIGS. 13 to 18 show the fourth embodiment of the present invention. In the fourth embodiment, as shown in FIG. 13, an n+-type buried layer 112 is selectively formed on the surface of a p-type Si substrate 111. In this state, an n-type Si epitaxial layer 113 is grown on the Si substrate 111.

An $SiO_2$ film 114 is formed in the element isolation region of the Si epitaxial layer 113 by LOCOS method. At this time, since the $SiO_2$ film 114 has a bird's head, the $SiO_2$ film 114 is planarized by coating a photoresist (not shown) and etching this photoresist and the $SiO_2$ film 114 back.

Thereafter, an n+-type region 115 serving as a plug-in region for a collector electrode is formed in the Si epitaxial layer 113, and ions are implanted in the Si epitaxial layer 113 to form a p+-type region 116 serving as a channel stopper under the $SiO_2$ film 114. An $SiO_2$ film 117 is formed on the entire surface of the resultant structure, and an opening 121 reaching the Si epitaxial layer 113 is formed in the $SiO_2$ film 117.

Thereafter, a polysilicon film 122 is deposited on the entire surface of the resultant structure by a low-pressure CVD method, and a p-type impurity is doped in the polysilicon film 123 at a high concentration by ion implantation. A photoresist 123 is processed into a pattern of a base extracting electrode, and the polysilicon film 122 is patterned using the photoresist 123 as a mask. The photoresist 123 is removed thereafter.

Figure 14:
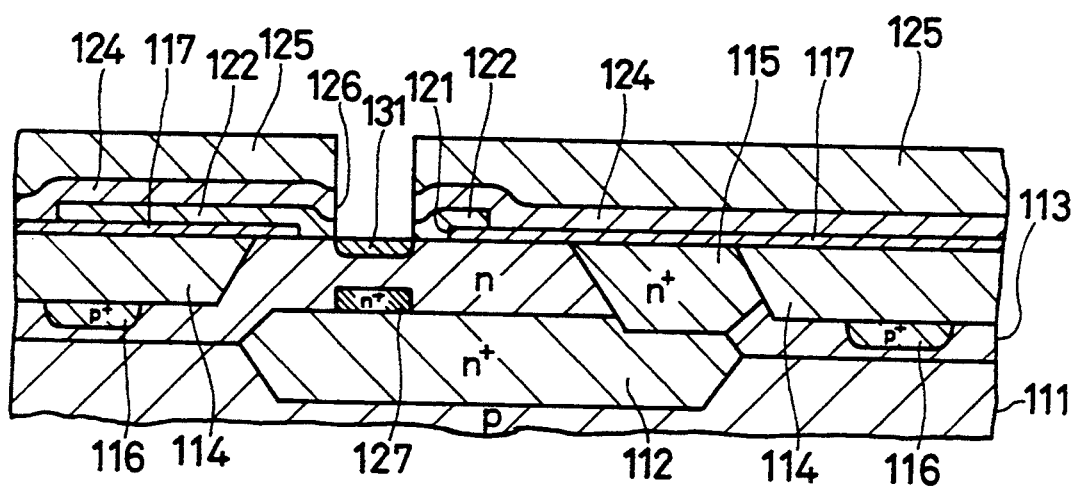

As shown in FIG. 14, an $SiO_2$ film 124 is deposited on the entire surface of the resultant structure by a CVD method. A photoresist 125 is processed into a pattern of a region in which an emitter and a base are to be formed, and an opening 126 is formed in the $SiO_2$ film 124 and the polysilicon film 122 using the photoresist 125 as a mask. Therefore, the opening 126 is formed in the opening 121.

Thereafter, Phos+ is ion-implanted in the resultant structure at an energy of 300 to 400 keV and a dose of about $10^{12}$ to $10^{13}$ cm$^{-2}$ using the photoresist 125 and the $SiO_2$ film 124 as masks to form an n+-type region 127 serving as a pedestal ion implantation portion below the opening 126. After the photoresist 125 is removed, a p-type region 131 serving as a link base is formed by ion implantation.

Figure 15:
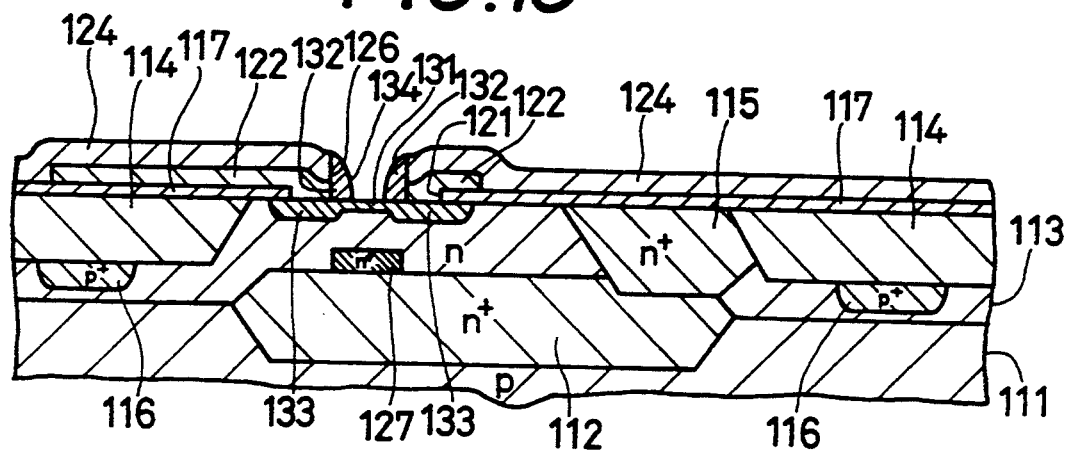

As shown in FIG. 15, after an $SiO_2$ film 132 is deposited on the entire surface of the resultant structure by a CVD method, annealing is performed. As a result, an impurity is solid-phase-diffused from the polysilicon film 122 to the Si epitaxial layer 113 through the opening 121 to form a p+-type region 133 serving as a graft base.

Thereafter, the $SiO_2$ film 132 is entirely etched back to form a side wall constituted by the $SiO_2$ film 132 on the inner surface of the opening 126. Therefore, an opening 134 is formed inside the $SiO_2$ film 132 serving as the side wall.

Figure 16:
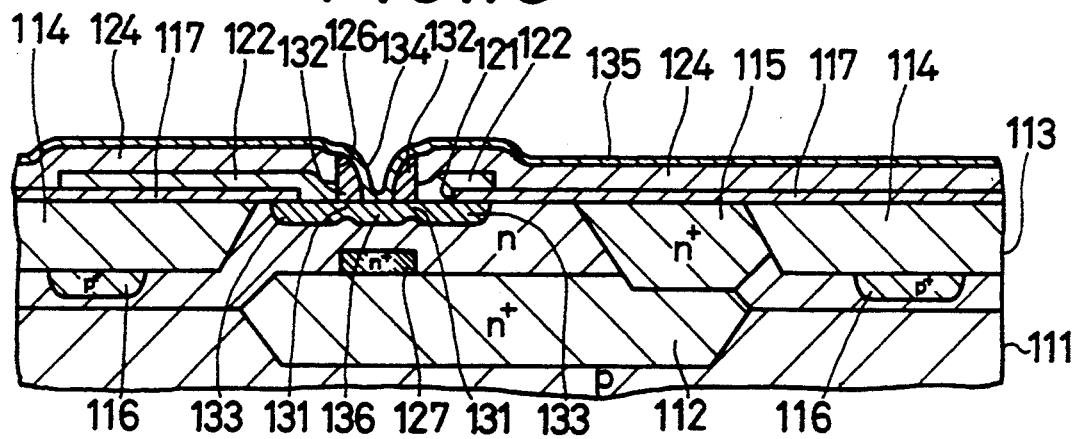

As shown in FIG. 16, a polysilicon film 135 having a thickness of about 0.1 to 0.2 $\mu$m is deposited on the entire surface of the resultant structure by a CVD method, and $BF_2^+$ is ion-implanted in the polysilicon film 135 at an energy of about 50 keV and a dose of about 1 to 5 $\times 10^{14}$ cm$^{-2}$.

Thereafter, the resultant structure is annealed at a temperature of about 900° C. for 30 minutes. As a result, B+ is solid-phase-diffused from the polysilicon film 135 to the Si epitaxial layer 113 through the opening 134 to form a p-type region 136 serving as a base.

Figure 17:
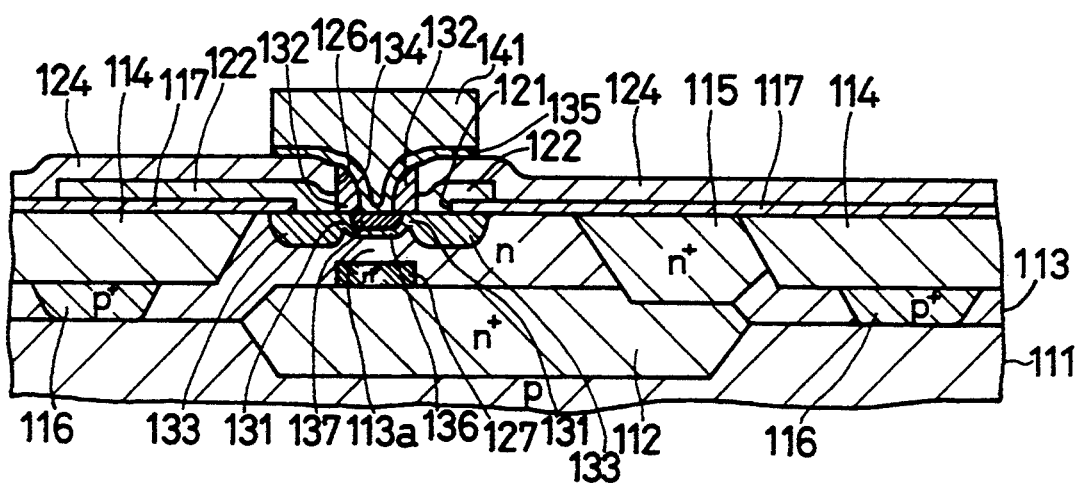

As+ is ion-implanted in the polysilicon film 135 at an energy of about 50 keV and a dose of about 1 to 2$\times 10^{16}$ cm$^{-2}$, and annealing is performed at a temperature of about 1,000° to 1,100° C. for 5 to 10 seconds. As a result, the As+ is solid-phase-diffused from the polysilicon film 135 to the Si epitaxial layer 13 through the opening 134 to form an n+-type region 137 serving as an emitter as shown in FIG. 17. Note that an Si epitaxial layer 113$a$ immediately below the p-type region 136 serving as a base serves as a collector.

Thereafter, a photoresist 141 is processed to have a pattern of an emitter extracting electrode, and the polysilicon film 135 is patterned using the photoresist 141 as a mask. This photoresist 141 is removed thereafter.

Figure 18:
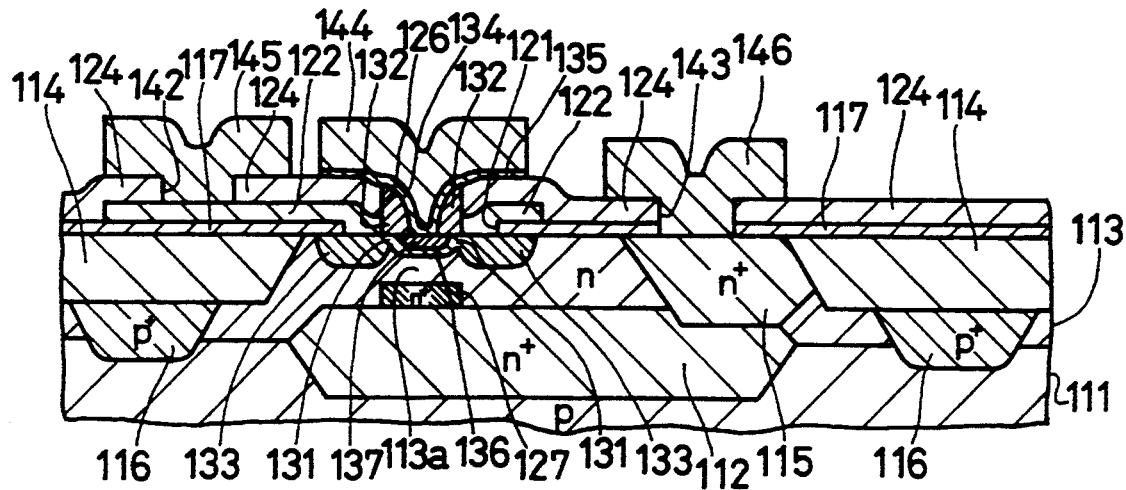

As shown in FIG. 18, openings 142 and 143 reaching the polysilicon films 122 and the n+-type region 115 are formed in the $SiO_2$ films 124 and 117, respectively. In this state, an Al film is deposited on the entire surface of the resultant structure by sputtering. This Al film is patterned to formal films 144, 145, and 146 respectively serving as an emitter electrode, a base electrode, and a collector electrode, thereby completing an npn bipolar transistor.

In the above fourth embodiment, as described in the step of FIG. 14, when the n+-type region 127 serving as a pedestal ion implantation portion is to be formed, the photoresist 125 and the $SiO_2$ film 124 are used as masks. For this reason, in this embodiment, the thickness of the $SiO_2$ film 124 can be preferably decreased compared with the above prior art wherein only the $SiO_2$ film 124 is used as a mask.

Therefore, as is apparent from FIG. 18, the openings 126, 142, and 143 have small steps, and the Al films 144 to 146 are rarely disconnected at the step portions of the openings 126, 142, and 143.

The fifth embodiment will be described below. In the fifth embodiment, substantially the same steps as those of the fourth embodiment are executed except that, in the step of FIG. 14 in the fourth embodiment, an opening 126 is formed halfway in a polysilicon film 122 before an n+-type region 127 is formed, and the opening 126 is formed in the rest of the polysilicon film 122 after the n+-type region 127 is formed.

When an RIE operation is performed to form the opening 126, pollutant such as carbon fluoride which is a material of a reactive gas and heavy metals or carbon contained in a photoresist 25 are adhered to the bottom surface and the inner surface of the opening 126. The photoresist 25 contains the heavy metals such as Na, K, Mg, Ca, Cu, Al, Fe, and the like, and it contains large amounts of Na and Fe especially.

Therefore, as in the fourth embodiment, when the opening 126 is completely formed before the n+-type region 127 is formed, during pedestal ion implantation for forming the n+-type region 127 the above pollutant and the like are knocked on into the Si epitaxial layer 113. As a result, the characteristics of the transistor may be degraded, or a production yield is decreased.

In this fifth embodiment however during pedestal ion implantation, a part of the polysilicon 122 is left on the bottom portion of the opening 126. Therefore, the degradation of the characteristics of the transistor and the decrease in production yield can be prevented by preventing the knock-on operation.

An energy for the pedestal ion implantation has an optimal value. This optimal value is defined by the thickness of the remaining Si epitaxial layer 113 under the p-type region 136 serving as a base and the junction depth of a p+-type region 133 serving as a graft base.

For example, assuming that the thickness of the remaining Si epitaxial layer 113 is set to be 0.7 to 0.8 $\mu$m and the junction depth of the p+-type region 133 is set to be 0.3 to 0.4 $\mu$m, a projection range in the Si epitaxial layer 113 is optimally set to be 0.45 to 0.5 $\mu$m, the energy of the pedestal ion implantation becomes 300 to 400 keV as described above.

When the ion implantation having the above energy is to be performed by an ion implantation system of a 400-keV class, the maximum thickness of the polysilicon film 122 left on the bottom portion of the opening 126 must be set to be about 100 nm. Therefore, when the thickness of the polysilicon film 122 is set to be about 150 nm, in this fifth embodiment, the polysilicon film 122 is etched to the amount of a thickness of about 50 nm by RIE before the n+-type region 127 is formed.

The sixth embodiment will be described below. In the sixth embodiment, substantially the same steps as those of the fourth and fifth embodiments are executed except that, in the step of FIG. 14 in the fourth embodiment, an opening 126 is formed in only an SiO$_2$ film 124 before an n+-type region 127 is formed, and the opening 126 is completely formed in the polysilicon film 122 after the n+-type region 127 is formed.

In the sixth embodiment, under the conditions described in the fifth embodiment, pedestal ion implantation is performed using an ion implantation system of a 500- to 600-key class. When this ion implantation system is used, even when the polysilicon film 122 having a thickness of about 150 nm is entirely left, the n+-type region 127 can be formed at the same depth as that of the fifth embodiment.

The seventh embodiment will be described below. In the seventh embodiment, substantially the same steps as those of the fourth to sixth embodiments are executed except that, in the step of FIG. 14 in the fourth embodiment, an opening 126 is not formed before an n+-type region 127 is formed, pedestal ion implantation is performed using a patterned photoresist 125 as a mask, and the opening 126 is formed in an SiO$_2$ film 124 and a polysilicon film 122 through their film thicknesses after the n+-type region 127 is formed. The above seventh embodiment can be performed using an ion implantation system of an MeV class.

The eighth embodiment for performing a high-speed operation of a bipolar transistor and obtaining high-precision resistor element according to the present invention will be described with reference to FIGS. 19 to 24.

Figure 19:
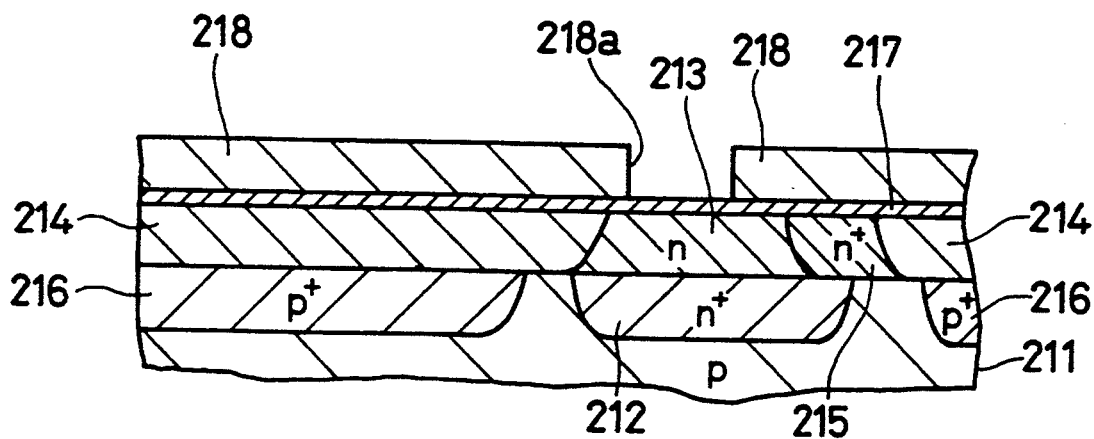
FIGS. 19 to 24 are views showing the steps of a method of manufacturing a semiconductor device according to the eighth embodiment of the present invention.

In the eighth embodiment, as shown in FIG. 19, As+ is selectively ion-implanted in a p-type Si substrate 211 at an energy of about 40 keV and a dose of about $5 \times 10^{15}$ cm$^{-2}$, and the As+ is thermally diffused to form an n+-type buried layer 212 serving as a buried collector. An n-type Si epitaxial layer 213 is grown on the Si substrate 211 to have a thickness of about 1.2 $\mu$m.

Thereafter, an SiO$_2$ film 214 having a thickness of about 0.8 $\mu$m is formed in the element isolation region of the Si epitaxial layer 213 by a recessed LOCOS method. Phos+ is selectively ion-implanted in the resultant structure at an energy of about 50 keV and a dose of about $5 \times 10^{15}$ cm$^{-2}$ and thermally diffused to form an n+-type region 215 serving as a plug region of a collector electrode in the Si epitaxial layer 213.

Since the SiO$_2$ film 214 has a bird's head up to this time, the SiO$_2$ film 214 is planarized by coating a resist and entirely performing RIE. B+ is selectively ion-implanted in the resultant structure at an energy of about 360 keV and a dose of about $4 \times 10^{13}$ cm$^{-2}$ to form a p+-type region 216 serving as a channel stopper under the SiO$_2$ film 214.

Thereafter, an SiO$_2$ film 217 having a thickness of about 0.1 $\mu$m is deposited on the entire surface of the resultant structure by a CVD method using TEOS as a source. A photoresist 218 is patterned on the SiO$_2$ film to have a pattern window 218$a$ of a region for forming an emitter, an intrinsic base, and an external base.

Figure 20:
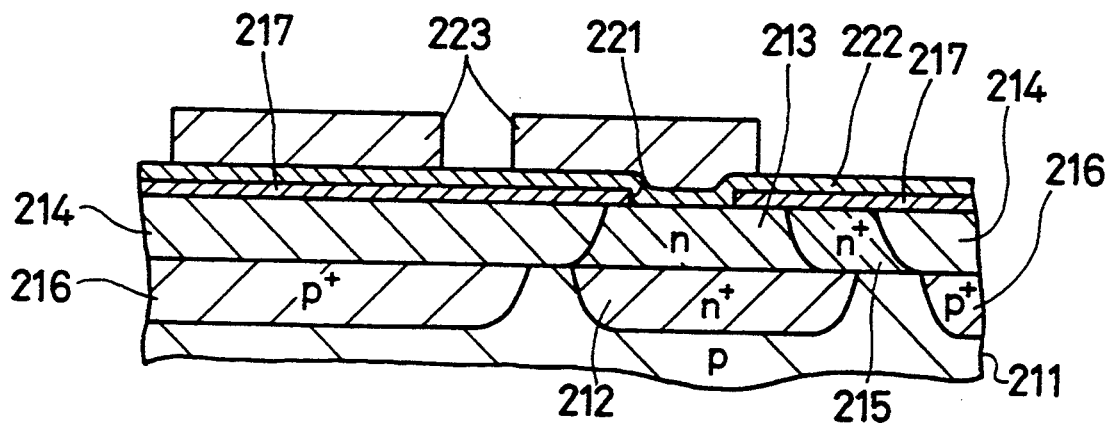

As shown in FIG. 20, an opening 221 is formed in the SiO$_2$ film 217 by RIE using the photoresist 218 as a mask. A pure polysilicon film 222 containing no impurity is deposited on the entire surface of the resultant structure by a CVD method to have a thickness of about 0.15 $\mu$m.

Thereafter, a portion of the polysilicon film 222 to be used as a resistor element is ion-implanted with an impurity using a photoresist (not shown) as a mask at a dose for obtaining a desired resistance.

A portion to be used as a base extracting electrode and a portion to be used as a resistor element extracting portion of the polysilicon film 222 are ion-implanted with BF$_2$+ using another photoresist (not shown) as a mask at an energy of about 30 keV and a dose of about $5 \times 10^{15}$ cm$^{-2}$. Thereafter, a photoresist 223 is patterned on the polysilicon film 222 into the patterns of the resistor element and the base extracting electrode.

Figure 21:
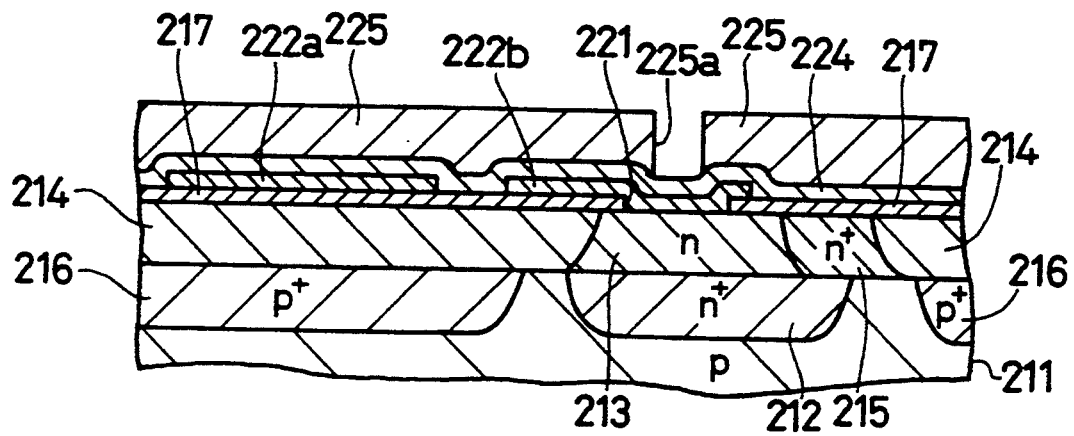

As shown in FIG. 21, the polysilicon film 222 is processed into polysilicon films 222$a$ and 222$b$ of the patterns of the resistor element and the base extracting electrode by RIE using the photoresist 223 as a mask.

Thereafter, an SiO$_2$ film 224 having a thickness of about 0.3 $\mu$m is deposited on the entire surface of the resultant structure by a CVD method, and a photoresist 225 is patterned on the SiO$_2$ film 224 to have a pattern window 225$a$ of a region for forming an emitter and an intrinsic base.

Figure 22:
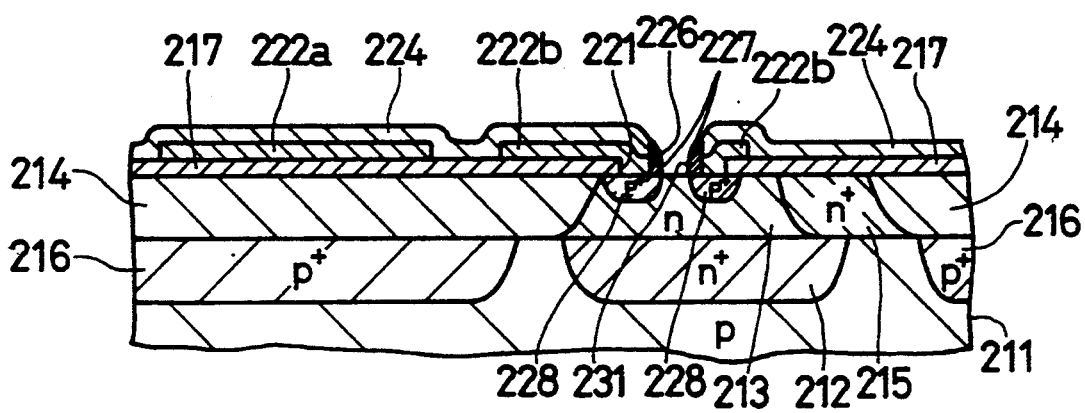

As shown in FIG. 22, an opening 226 is formed in the SiO$_2$ film 224 and the polysilicon film 222$b$ by RIE using the photoresist 225 as a mask. An SiO$_2$ film 227 having a thickness of about 0.6 $\mu$m is deposited on the entire surface of the resultant structure by a CVD method using TEOS as a source.

Thereafter, the resultant structure is annealed in an N$_2$ atmosphere at a temperature of about 900° C. for about 15 minutes. As a result, the SiO$_2$ film 227 is densified, and B+ is solid-phase-diffused from the polysilicon film 222$b$ to the Si epitaxial layer 213 through the opening 221 to form a p+-type region 228 serving as an external base.

At this time, the resultant structure is annealed by radiation of an eximer laser beam having a power of about 350 mJ/cm$^2$, such that dangling bonds at grain boundary of the polysilicon films 222a and 222b are terminated to improve the crystallinity of the polysilicon films 222a and 222b. Thereafter, RIE is performed to the entire surface of the SiO$_2$ film 227 to form a side wall consisting of the SiO$_2$ film 227 on the inner peripheral surface of the opening 226. Therefore, an opening 231 is further formed inside the SiO$_2$ film 227 serving as the side wall.

Figure 23:
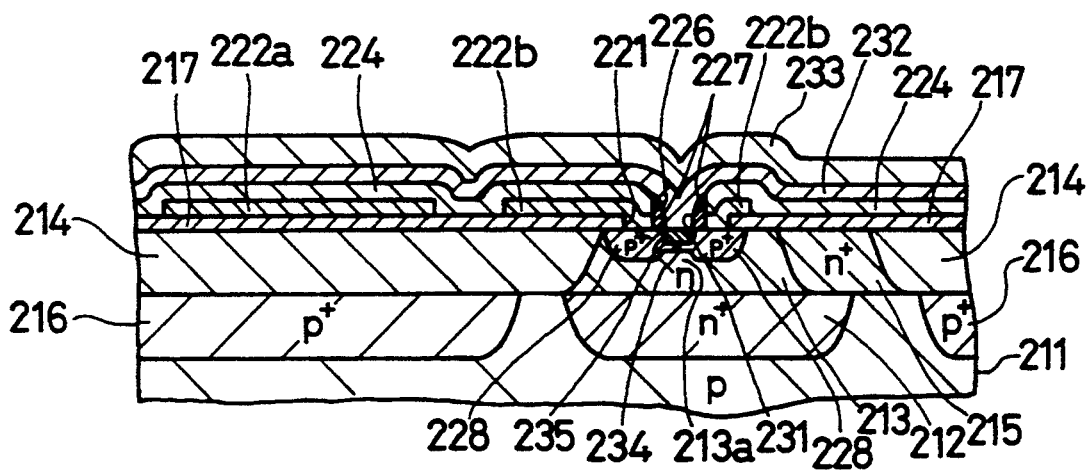

After BF$_2$+ is ion-implanted in the Si epitaxial layer 213 through the opening 231, as shown in FIG. 23, a polysilicon film 232 having a thickness of about 0.15 μm is deposited on the entire surface of the resultant structure by a CVD method. After As+ is ion-implanted in the polysilicon film 232 at an energy of about 40 keV and a dose of about 1.5×10$^{16}$ cm$^{-2}$, an SiO$_2$ film 233 having a thickness of about 0.3 μm is deposited on the entire surface of the resultant structure by a CVD method.

Thereafter, high-temperature rapid thermal annealing is performed by radiation of an eximer laser beam having a power of about 1,000 mJ/cm$^2$ to diffuse B+ ion-implanted in the Si epitaxial layer 213 and to solid-phase-diffuse As+ from the polysilicon film 232 to the Si epitaxial layer 213, thereby forming a p-type region 234 and an n+-type region 235 respectively serving as an intrinsic base and an emitter. Note that an Si epitaxial layer 213a immediately below the p-type region 234 is to be used as a collector.

During eximer laser annealing for forming the p-type region 234 and the n+-type region 235, the polysilicon film 232 is present on the entire surface of the resultant structure, and the eximer laser beam is not easily transmitted through the polysilicon film 232. For this reason, the polysilicon film 222a is not annealed together with the polysilicon film 232. Therefore, the p-type region 234 and the n+-type region 235 having a shallow junction can be formed, and the polysilicon film 222a having a highly accurate resistance can be formed.

Figure 24:
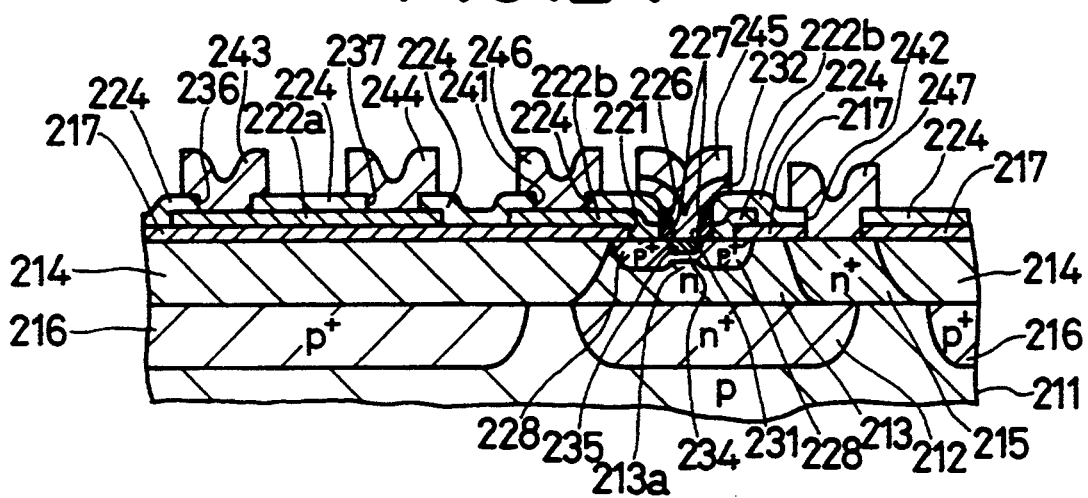

As shown in FIG. 24, the SiO$_2$ film 233 is removed by wet etching. The SiO$_2$ film 233 is used because an out-diffusion of an impurity for forming the p-type region 234 and the n+-type region 235 is prevented and an absorbency for an eximer laser beam is increased.

Thereafter, the polysilicon film 232 is processed into a pattern of an emitter extracting electrode, and openings 236, 237, 241, and 242 reaching the polysilicon films 222a and 222b and the n+-type region 215 are formed in the SiO$_2$ films 224 and 217. An Al film is deposited on the entire surface of the resultant structure by sputtering, and this Al film is patterned by RIE to form Al films 243 and 244 serving as resistor electrodes and Al films 245 to 247 serving as an emitter electrode, a base electrode, and a collector electrode.

In the above embodiments, the present invention is applied to the manufacture of a semiconductor integrated circuit device including a resistor element and a bipolar transistor having a two-layered polysilicon film structure. However, even when the present invention is applied to the manufacture of a semiconductor integrated circuit device in which a stacked contact polysilicon film, a resistor element polysilicon film, a thin film transistor polysilicon film, or the like are formed on the polysilicon gate electrode of a MOS transistor, the above polysilicon film can be annealed without an increase in depth of a source-drain junction.

What is claimed is:

1. A method of manufacturing a semiconductor device, comprising the steps of:
    after a first insulating film, a first semiconductor layers of a second conductivity type, and a second insulating film are sequentially stacked on a substrate of a first conductivity type, forming a first opening to reach a surface of said substrate;
    after a second semiconductor layer of the second conductivity type and a third insulating film are sequentially stacked on the entire surface of the resultant structure including said first opening, etching back said third insulating film by anisotropic etching to be left on a side wall of said second semiconductor layer, and removing said second semiconductor layer on said substrate by isotropic etching using said third insulating film as a mask to expose a part of said substrate, thereby forming a second opening;
    forming a first single-crystal semiconductor layer of the second conductivity type in said second opening using a molecular beam epitaxial selective growth method; and
    forming a third semiconductor layer of the first conductivity type on said first single-crystal semiconductor layer.

2. A method according to claim 1, wherein said third semiconductor layer is formed by a molecular beam epitaxial selective growth method.

3. A method of manufacturing a semiconductor device, comprising the steps of:
    after a first insulating film is formed on a substrate of a first conductivity type, sequentially stacking a second insulating film having etching characteristics different from those of said first insulating film, a first semiconductor layer of a second conductivity type, and a third insulating film on said first insulating film;
    after a first opening reaching a surface of said first insulating film is formed, selectively side-etching only said second insulating film by isotropic etching to form a first undercut portion;
    after a second semiconductor layer of the second conductivity type is deposited on an entire surface of the resultant structure including said first opening, leaving said second semiconductor layer only in said first undercut portion;
    after a fourth insulating film having etching characteristics different from those of said first insulating film is formed, etching back said fourth insulating film by anisotropic etching to leave said fourth insulating film only on a side wall of said first opening;
    removing said first insulating film from said substrate by isotropic etching using said third and fourth insulating films as masks to expose a part of said substrate, so that a second opening and a second undercut portion in said first insulating film are formed;
    forming a first single-crystal semiconductor layer of the second conductivity type in said second opening using a molecular beam epitaxial selective growth method; and
    forming a third semiconductor layer of the first conductivity type on said first single-crystal semiconductor layer.

4. A method according to claim 3, wherein said third semiconductor layer is formed using a molecular beam epitaxial selective growth method.

* * * * *